(12) United States Patent
Takasu

(10) Patent No.: US 6,853,027 B2
(45) Date of Patent: *Feb. 8, 2005

(54) SEMICONDUCTOR NONVOLATILE MEMORY WITH LOW PROGRAMMING VOLTAGE

(75) Inventor: Hidemi Takasu, Kyoto (JP)

(73) Assignee: Rohm Company, Ltd., Kyoto (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/726,865

(22) Filed: Oct. 4, 1996

(65) Prior Publication Data

US 2002/0011621 A1 Jan. 31, 2002

Related U.S. Application Data

(63) Continuation-in-part of application No. 08/488,558, filed on May 30, 1995, now abandoned, which is a continuation of application No. 08/212,697, filed on Mar. 14, 1994, now abandoned, which is a continuation-in-part of application No. 08/098,233, filed on Jul. 29, 1993, now abandoned, which is a continuation of application No. 07/867,250, filed on Apr. 10, 1992, now abandoned.

(30) Foreign Application Priority Data

Oct. 30, 1991 (JP) ............................................. 3/285015

(51) Int. Cl.[7] ....................... H01L 29/788; H01L 29/76; H01L 29/792
(52) U.S. Cl. ....................... 257/315; 257/314; 257/316; 257/321; 257/324; 257/325
(58) Field of Search ............................. 357/23.5, 23.15, 357/41; 257/316, 321, 324, 325, 314, 315

(56) References Cited

U.S. PATENT DOCUMENTS

| 5,619,051 A | * | 4/1997 | Endo | 257/324 |
| 5,796,139 A | * | 8/1998 | Fukase | 257/315 |

FOREIGN PATENT DOCUMENTS

| JP | 51-108582 | 9/1976 | 257/316 |
| JP | 52-42381 | 4/1977 | 257/314 |
| JP | 55-128873 | 10/1980 | 257/316 |
| JP | 57-172771 | 10/1982 | 257/314 |
| JP | 57-172772 | 10/1982 | 257/314 |
| JP | 61-59714 | 3/1986 | 257/295 |
| JP | SHO 64-035963 | 2/1989 | 257/324 |
| JP | 03-32066 | 2/1991 | 257/316 |
| JP | 03-42876 | 2/1991 | 257/315 |
| JP | HEI 04-348072 | 12/1992 | 257/324 |

* cited by examiner

Primary Examiner—Steven Loke
(74) Attorney, Agent, or Firm—Ronald C. Fish; R. C. Fish Law Corp.

(57) ABSTRACT

A semiconductor nonvolatile memory cell comprised of a p-type silicon well 12, an n+ drain 8 and an n+ source 10, the source and the drain regions defining an channel region 7. On top of the well 12 there are laminated a thin silicon dioxide film 2 served as a gate oxide, a polysilicon layer 32 and a SrTiO₃ layer 34 comprised of a high dielectric substance, in respective order. Further on top of these layers, there is formed a polysilicon layer 36 served as gate electrode. By using the memory cell and appropriate select transistors, a semiconductor nonvolatile memory device is constructed.

6 Claims, 9 Drawing Sheets

| | WL | | BL | | SL |
|---|---|---|---|---|---|
| | i | j | m | n | |
| ERASE (High Vth) | +10 | 0 | 0 | 0 | 0 |
| PROGRAM (Low Vth) | −5 | 0 | 5 | 0 | 0 |
| READ | 2 | −2 | 2 | − | 0 |

(i, m): Selected Bit ized SEMICONDUCTOR NONVOLATILE MEMORY WITH LOW PROGRAMMING VOLTAGE This is a file wrapper continuation-in-part application of a U.S. patent application Ser. No. 08/488,558, Filed May 30, 1995 (now abandoned), which was a file wrapper continuation of a U.S. patent application Ser. No. 08/212,697, Filed Mar. 14, 1994 (now abandoned), which was a file wrapper continuation-in-part of a U.S. patent application Ser. No. 08/098,233, Filed Jul. 29, 1993 (now abandoned), which was a file wrapper continuation of a U.S. patent application Ser. No. 07/867,250, Filed Apr. 10, 1992 (now abandoned).

CROSS-REFERENCE TO RELATED APPLICATION

This application is a continuation-in-part of application of Ser. No. 867,250, filed Apr. 10, 1992, for Semiconductor Nonvolatile Memory.

BACKGROUND OF THE INVENTION

1. Field of the Invention

The present invention relates to semiconductor nonvolatile memory and, more particularly, to reduction of the applied programming voltage to write and erase information therein.

2. Description of the Prior Art

Floating gate type memory is well known to be useful as the semiconductor nonvolatile memory ($E^2PROM$). FIG. 1 schematically illustrates in section the construction of a prior art memory cell 1 of a floating gate type memory.

Referring to FIG. 1, there is formed a silicon substrate with a p-type silicon well 12 formed therein. A channel region 14 is formed from an n+drain 8 and an $n^+$ source 10 provided within the well 12. On top of the silicon well 12 there are formed a silicon dioxide film 2, a polysilicon layer 4 on top of film 2 and a silicon dioxide film 5 on top of layer 4. Further on top of film 5 there is formed a polysilicon control gate electrode 6. The silicon dioxide film 2 has a thin portion 2a on top of drain 8 and the thickness of the portion 2a is 10 nm.

Information can be written and erased into and from the memory cell 1 constructed as described above by electricity. The memory cell 1 has two stable information states: one in which a logic "0" has been written therein and the other in which the logic "0" has been erased and a logic "1" has been stored. The fact that the memory cell 1 can take the two stable states is utilized for fabrication of a memory.

Operation of writing and erasing information into and from the memory cell 1 will be described below. To write a logic "0" into the memory cell 1, a high voltage which may be as much as approximately 20 voltage is applied to the drain 8 of the memory cell 1 relative to the gate electrode 6. As a result of application of this voltage, an electric field develops between the gate electrode 6 and the drain 8 which causes some of electrons within the polysilicon layer 4 to tunnel through the portion 2a and enter the drain 8. This means that the memory cell 1 has the logic "0" written. The memory cell 1 with the logic "0" serves as a transistor with the lower threshold voltage. "Threshold voltage" is a gate voltage at which a current begins to flow between the source and the drain when the voltage applied to the gate electrode relative to the source is made to increase.

Meanwhile, to erase the logic "0" from the memory cell 1 and store the logic "1" therein, some of electrons within the drain 8 need injecting into the polysilicon layer 4. This is effected by generating an electric field of the opposite polarity to that produced when writing the logic "0" by applying a voltage of approximately 20 V to the gate electrode 6 relative to the drain 8 thereof. In this stable state in which the logic "0" is erase from the memory cell or the logic "1" is stored therein, the memory cell 1 serves as a transistor with the higher threshold voltage.

Next, the operation of reading information from the memory cell 1 will be described. It is decided whether a logic "0" is stored or a logic "1" is stored in each memory cell by determining whether or not current flows through the channel region 14 when a voltage of some 5 V is applied between the source 10 and the drain 8 of the memory cell 1 and no gate voltage is applied to gate 6.

More specifically, Since the memory cell 1 with a logic "0" behaves like a transistor with the lower threshold voltage as described above, and the applied gate voltage of 0 volts exceeds the lower threshold voltage there flows current through the channel region 14. Meanwhile, when a logic "1" is stored in the memory cell 1, the memory cell 1 behaves like a transistor with the higher threshold voltage as described above, and the applied gate voltage of 0 volts does not exceed the higher threshold voltage. Thus no current flows through the channel region 14.

A semiconductor nonvolatile memory may be constructed by using memory cells such as described above coupled with read and write control transistor.

The above-mentioned nonvolatile semiconductor memory device has the following problem.

With progress of the semiconductor industry, the need for integrated nonvolatile semiconductor memories has arisen. The memories have had difficulties in further integration thereof. One of the difficulties is that the memory requires a highly insulated structure. That is because an applied programming voltage can destroy the device when the device does not have the highly insulated structure. Avoidance of the destruction is effected by reduction in applied programming voltage.

However, to write information into the memory, electrons need moving from the polysilicon layer 4 to the drain 8 through the silicon dioxide film portion 2a. More specifically, a certain electric field strength or more has to be applied to the portion 2a so that the electrons could tunnel through the portion 2a.

Meanwhile when the programming write voltage is applied to the gate of the memory cell 1 constructed as described above relative to the drain, the electric field strength applied to the portion 2a is given by $$E = \frac{C1 + C3}{L \times (C1 + C2 + C3)} V_S$$

where C1, C2 and C3 are an electric capacity between the polysilicon layer 4 and the polysilicon layer 6, an electric capacity between the polysilicon layer 4 and the drain 8 and an electric capacity between the polysilicon layer 4 and the p-type well 12, respectively. L is the thickness of the porion 2a of the silicon dioxide film.

Accordingly, when silicon dioxide is used as insulating layer, electric capacities C1, C2 and C3 are substantially same in the equation. Therefore, to make necessary electric field strength apply to the portion 2a, a thinner silicon dioxide film portion 2a has to be used or a high voltage which may be as much as 20 volts has to be applied to the gate 6. Because technology could limit the thinner silicon dioxide film portion 2a the high voltage of approximately 20 volts is necessary to write information in the memory cell. That limits reduction in the programming write voltage.

SUMMARY OF THE INVENTION

Accordingly, an object of the present invention is to provide a nonvolatile semiconductor memory device that allows information to be written therein at low voltage so that the miniaturization and integration of the nonvolatile semiconductor memory can be facilitated.

A device including a nonvolatile memory having write, erase and read modes, comprises:
 a) a first conductive type semiconductor region;
 b) a pair of second conductive type diffusion regions formed within the first conductive type semiconductor region;
 c) a first insulating layer formed on the first conductive type semiconductor region;
 d) a conductive layer formed on the first insulating layer;
 e) a second insulating layer formed on the conductive layer, the second insulating layer being comprised of a single layer of insulating material having a sufficiently high dielectric constant to lower a programming voltage needed to cause Fowler-Nordheim tunneling of charges into or out of the conductive layer through the first insulating layer in the write and erase modes, the programming voltage being to less than 7 volts to 13 volts and the second insulating layer also having a thickness sufficient to provide adequate insulating properties and breakdown voltage resistance; and
 f) a control electrode formed on the second insulating layer.

A method for manufacturing nonvolatile memories, comprises the steps of:
 a) preparing a substrate of semiconductor monocrystala having a first conductive type semiconductor region;
 b) forming an first insulating layer by oxidation on the substrate;
 c) forming a pair of second conductive type semiconductor region by diffusing a second conductive type dopant after applying a resist pattern onto a portion of the first insulating layer on which a control electrode will be eventually form;
 d) forming a conductive layer on the first insulating layer after removing the resist pattern;
 e) forming a second insulating layer on the conductive layer and growing a control electrode layer on the second insulating layer; and
 f) etching the control electrode layer using a resist pattern as a mask to form a control electrode.

The above, and other objects, features and advantages of the present invention will become apparent from the following description read in conjunction with the accompanying drawings, in which like reference numerals designate the same elements.

DETAILED DESCRIPTION OF THE INVENTION

Figure 1:
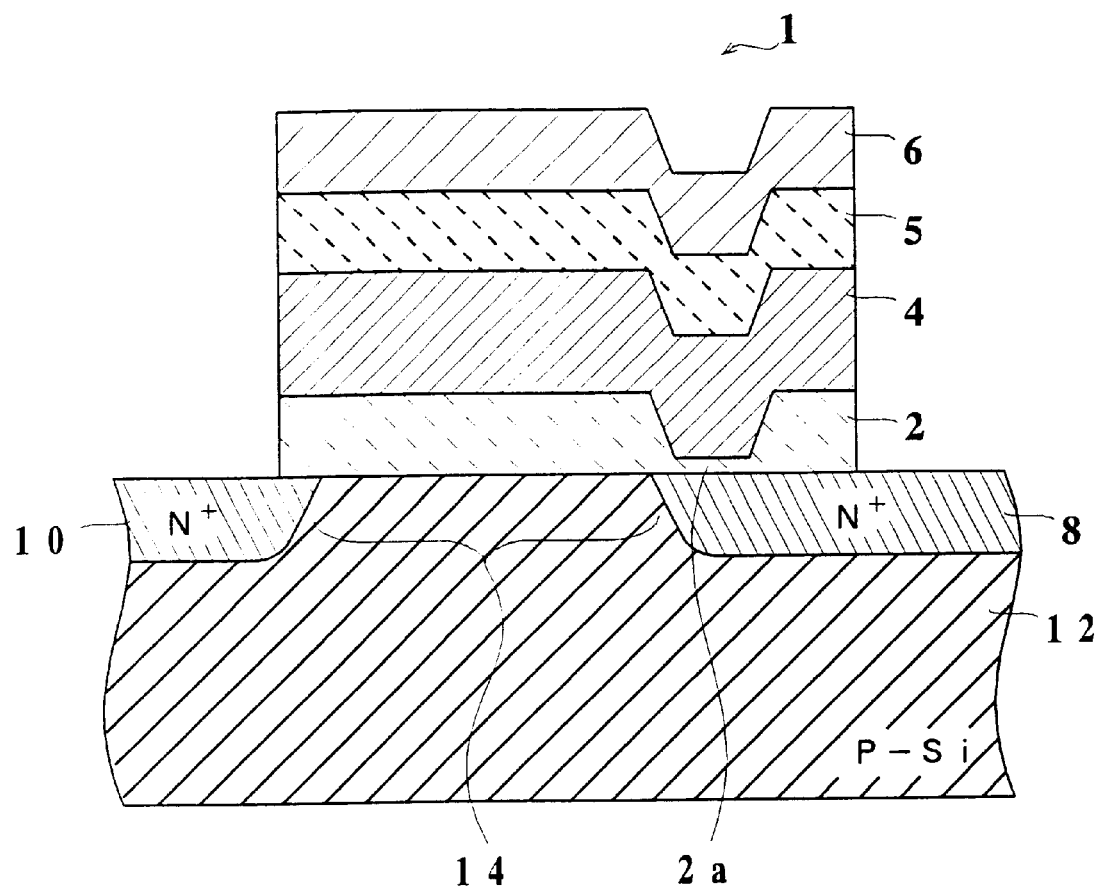
FIG. 1 is a view schematically showing the construction in section of a conventional memory cell 1.
Figure 2:
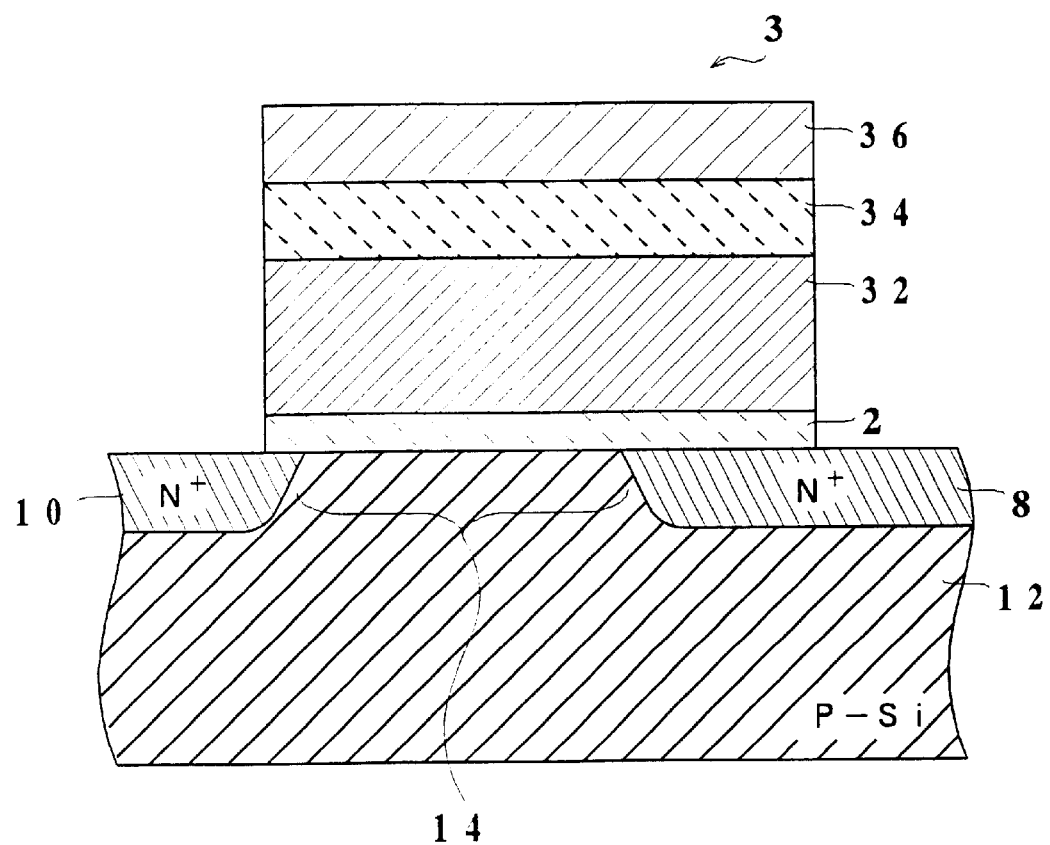
FIG. 2 is a view schematically showing the construction in section of a memory cell according to an embodiment of the present invention.

FIG. 2 shows a schematic in section of a memory cell 3 of a nonvolatile semiconductor memory device according to an embodiment of the present invention.

Referring to FIG. 2, a p-type silicon well 12 comprised of a first conductive type semiconductor region has formed therein an n$^+$drain 8 comprised of a second conductive type diffusion region, and an n$^+$ source 10 formed in the same way. The two source and drain regions define a channel region 14 therebetween in the well 12. On top of the well 12 there are laminated a thin silicon dioxide film 2 that is a first insulating layer which serves as a gate oxide, a polysilicon layer 32 that is a conductive layer and a SrTiO$_3$ layer 34, which serves as a second insulating layer, comprised of a high dielectric substance. As the high dielectric layer 34, utilizing a layer which has dielectric constant ε not less than 50 is preferable. A polysilicon layer 36 serving as a control electrode is formed on top of SrTiO$_3$ layer 34.

Information can be written and erased into and from the memory cell 3 constructed as described above by electricity. The memory cell 3 constructed as above has two stable states: a first state in which a logic "0" is stored and a second state in which the logic "0" has been erased and a logic "1" has been stored. These two stable states are utilized to implement a memory.

Figure 7:
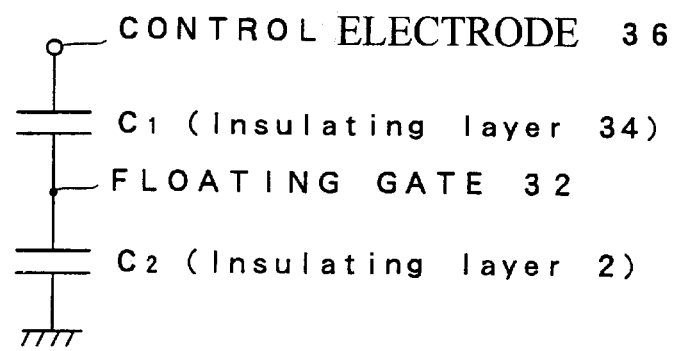
FIG. 7 is an equivalent circuit showing a divided voltage of insulating layer 3 in the memory cell of the present invention.

Operation of writing and erasing information into and from the memory cell 3 will be described below. To write a logic "0" into the memory cell 3, a voltage of approximately 10 V (possibly from 7 V to 13 V, preferably from 8 V to 12 V) is applied to the drain 8 of the memory cell 3 relative to the control electrode 36 thereof. As a result of application of this write voltage, some electrons within the polysilicon layer 32 have injected to the substrate 12 (into the channel region) through the thin silicon dioxide film 2 by Fowler-Nordheim tunneling (hereinafter referred as F-N tunneling). As described above, the programming write voltage of approximately 10 volts (possibly from 7 V to 13 V, preferably from 8 V to 12 V) can effect write operation. That is because the SrTiO$_3$ layer 32 is comprised of high dielectric substance and thus the partial pressure applied to the film 2 relative to the programming write voltage increases. As it is shown as a equivalent circuit in FIG. 7, the divided voltage of floating gate (polysilicon layer 32) can be increased by heightening dielectric constant of the insulating layer 34. In other word, in spite of the lower programming write voltage, the electric field strength can be obtained which is necessary to write information into the memory. This means that the memory cell 3 has the logic "0" written. The memory cell 3 with the logic "0" serves as a transistor with the lower threshold voltage.

Figure 8:
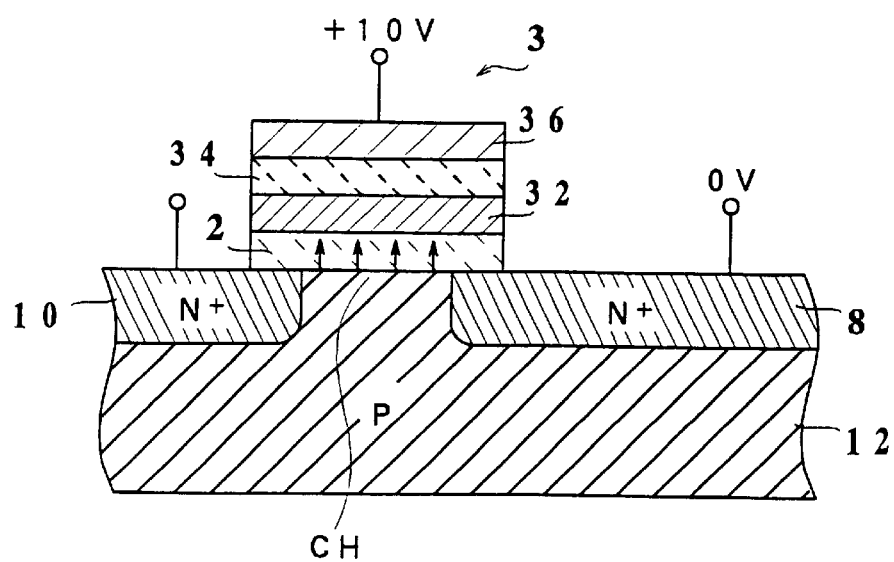
FIG. 8 is a view schematically showing a operation of erasing information in the memory cells 3.

Meanwhile, to erase the logic "0" from the memory cell 3 and store the logic "1" therein, some of electrons within the drain 8 need injecting into the polysilicon layer 32. Therefore, when the logic "1", generating an electric field of the opposite polarity to that produced when writing the logic "0" by F-N tunneling of the electrons. FIG. 8 shows a operation of erasing information from a memory cell 3. Initially, a voltage 0 V is applied to both the source 10 and the drain 8, and a voltage of approximately 10 V (possibly from 7 V to 13 V, preferably from 8 V to 12 V) is applied to the control electrode 36. As a result of above, N channel is formed at channel region CH, the channel decreases electric potential between the source 10 and the drain 8 as 0 V. At the same time, some of electrons within the channel CH have injected into the polysilicon layer 32 by tunneling. In this stable state in which the logic "0" is erased from the memory cell or the logic "1" is stored therein, the memory cell 3 serves as a transistor with the higher threshold voltage.

In this invention, the write voltage of 10 volts or below can effect write operation, and the erase voltage of 10 volts or below can effect erase operation.

Next, the operation of reading information from the memory cell 3 will be described. It is decided whether a logic "0" is stored or a logic "1" is stored in each memory cell by determining whether or not current flows through the channel region 14 when a voltage of some 5 V is applied between the source 10 and the drain 8 of the memory cell 3 and no gate voltage is applied to the gate 36.

More specifically, Since the memory cell 3 with a logic "0" behaves like a transistor with the lower threshold voltage as described above, and the applied gate voltage of 0 volts exceeds the lower threshold voltage there flows current through the channel region 14. Meanwhile, when a logic "1" is stored in the memory cell, the memory cell behaves like a transistor with the higher threshold voltage as described above, and the applied gate voltage of 0 volts does not exceed the higher threshold voltage. Thus no current flows through the channel region 14.

Next, an example of an LSI memory constructed using the aforementioned memory cell 3 will be given. First described is the principle of operation involved when information is written.

Figure 3:
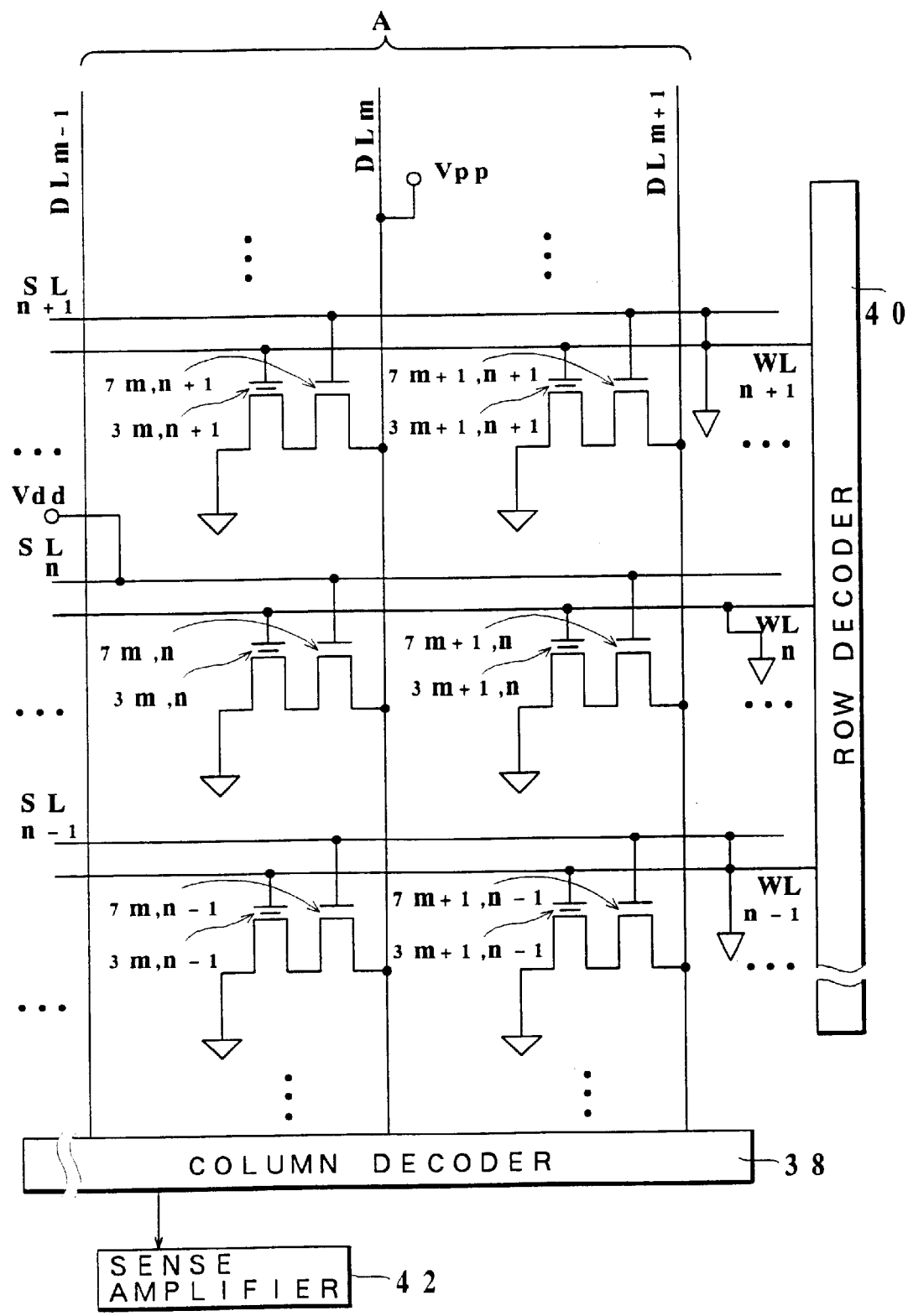
FIG. 3 is a conceptual view showing the construction of an LSI memory for explaining the principle of writing information into memory cells according to an embodiment of the present invention.

A conceptual view of the construction of a 1024-bit memory LSI is shown in FIG. 3.

A memory cell array A has 32 by 32, i.e. 1024 memory cells (1 K bits) arranged in matrix form. To the drain 8 of each memory cell 3 is connected the source of row select transistor 7. A row decoder 40 drives word lines WL which are each connected to the control electrode of each memory cell 3. Select control lines SL are each connected to the gate electrode of each row select transistor 7 to assist in writing and erasing information to the array. A column decoder 6 drives column data lines DLs which are each connected to the drain of each row select transistor 7.

Now the way in which information is written into a memory cell $3_{m,n}$ will be described with reference to FIG. 3. To write information into a memory cell at column m and row n, a programming voltage $V_{PP}$ need applying to only the control electrode 36 of the memory cell $3_{m,n}$ relative the drain 8 thereof. This is effected by applying the voltage $V_{PP}$ of some 10 volts to only the data line DLm with the decoder 38, applying a voltage $V_{dd}$ to only the Select control line SLn and applying ground voltage equal in potential to the well to all the word lines WL. It is noted that, in this state, the row select transistor 7, which is connected with the Select control line SLn, has a conductive channel formed between the source and the drain. As described above, an electric field develops between the polysilicon layer 32 and the drain 8 of only the memory cell $3_{m,n}$ which causes some of electrons within the polysilicon layer 32 to move into the drain 8. This means that the memory cell $3_{m,n}$ has the logic "0" written.

Figure 4:
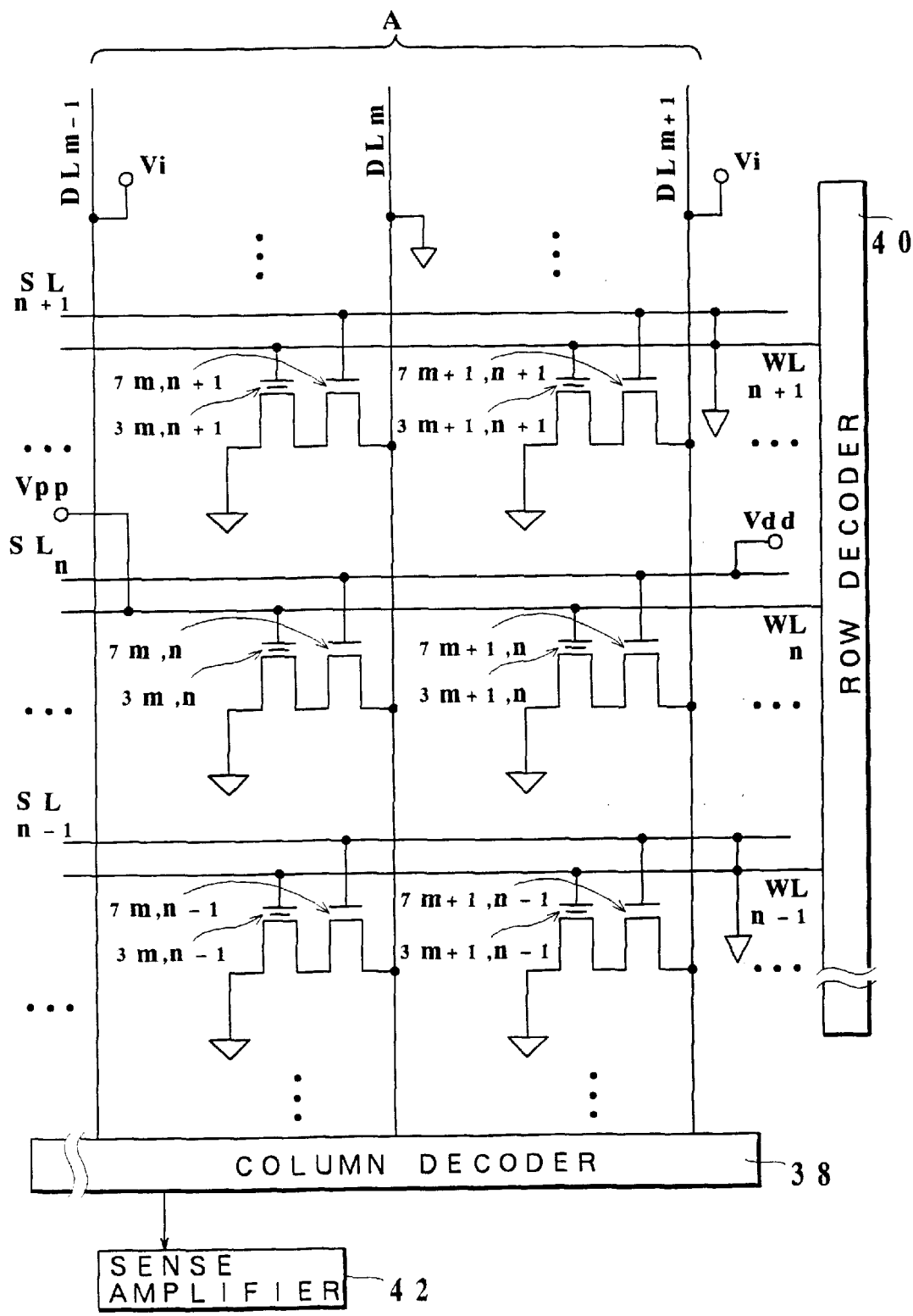
FIG. 4 is a conceptual view showing the construction of an LSI memory for explaining the principle of reading information from memory cells according to an embodiment of the present invention.

Next, the way in which only the logic "0" stored in the memory cell $3_{m,n}$ is erased and changes into a logic "1" will be described with reference to FIG. 4. The construction in shown in FIG. 4 is the same as shown in FIG. 3. To erase only the logic "0" stored in the memory cell $3_{m,n}$ an electric field of the opposite polarity to that produced when writing the logic "0" need to develop between the polysilicon layer 32 and the drain 8. This is effected by applying the voltage $V_{PP}$ of some 10 volts to only the word line WLn with the row decoder 40, applying the voltage $V_{dd}$ to only the Select control line SLn and applying ground voltage equal in potential to the well and an inhibit voltage Vi to the data line DLm and the rest of all data line, respectively. It is noted that, in this state, all the row select transistors 7, which are connected with the Select control line SLn, have each a conductive channel formed between the source and the drain. As described above, the electric field develops between the polysilicon layer 32 and the drain 8 of only the memory cell $3_{m,n}$ which causes some of electrons within the drain 8 to move into the polysilicon 32. This means that the logic "0" stored in the memory cell $3_{m,n}$ has changed into the logic "1".

Figure 5:
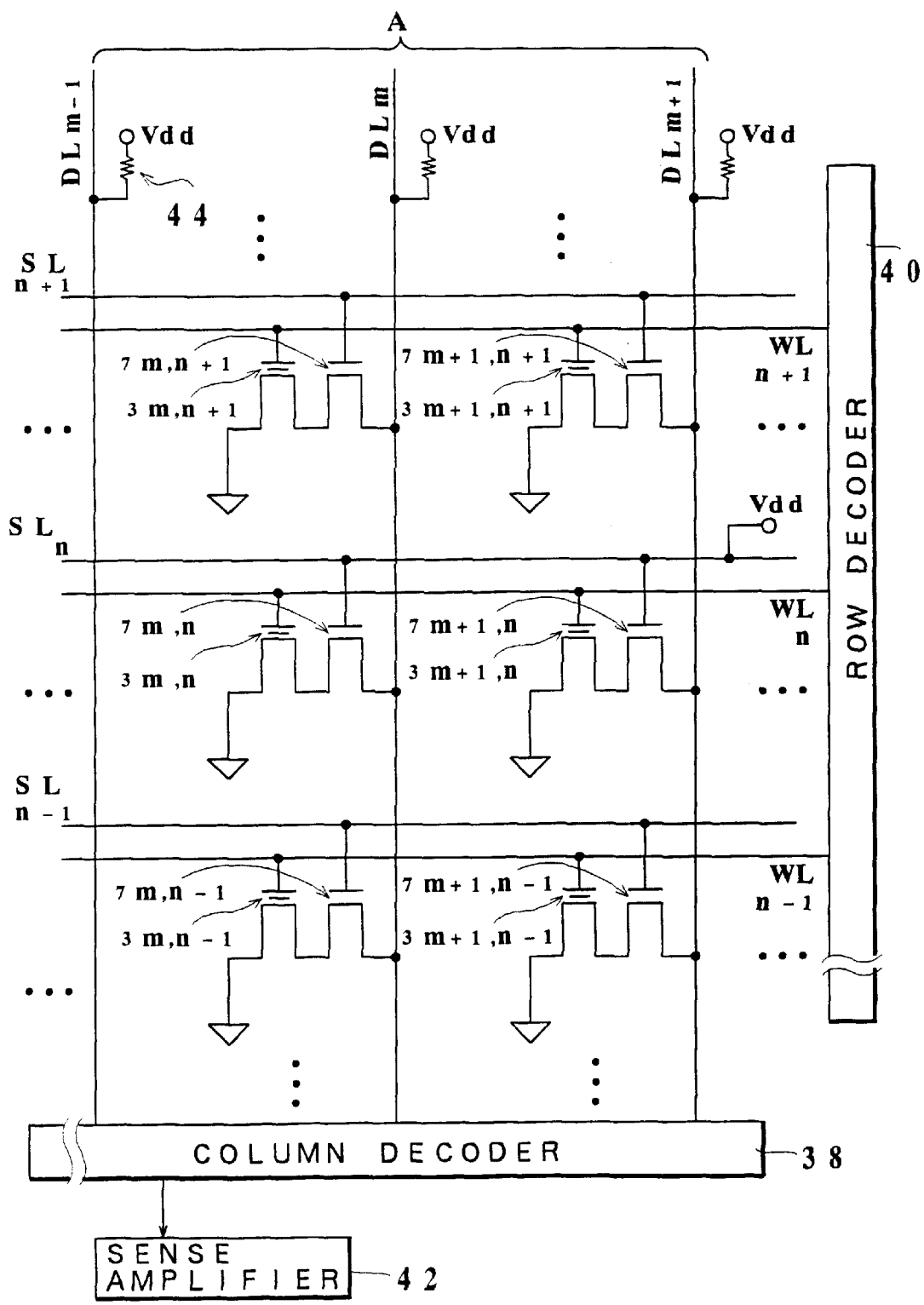
FIG. 5 is a conceptual view showing the construction of an LSI memory for explaining the principle of erasing information stored in memory cells according to an embodiment of the present invention.

The principle of operation for reading information from the memory cell $3_{m,n}$ is described below with reference to FIG. 5. The construction shown in FIG. 5 is the same as shown in FIG. 3. To read data stored in the memory cell $3_{m,n}$ the two possible stable states of the memory cell $3_{m,n}$ need distinguishing and the resulting information need putting out.

More specifically, the voltage $V_{dd}$ is applied to only the line SLn of Select control lines SL and the data line DLm has the voltage $V_{dd}$ applied to through a resistor 30. Also, the source 10 of the memory cell $3_{m,n}$ is grounded. As a result, there is a potential difference $V_{dd}$ between the source and the drain because the row select transistors $7_{m,n}$, which are connected with the Select control line SLn, have a conductive channel formed between the source and the drain. Further, To the control electrode 36 of the memory cell $3_{m,n}$ is applied through the word line WLn a voltage Vm which is halfway between the lower threshold voltage and the higher threshold voltage.

In this state, when the memory cell $3_{m,n}$ has a logic "0" stored therein its channel region 14 is conductive because the voltage Vm exceeds the lower threshold voltage of the memory cell $3_{m,n}$. The current flowing through data line $DL_m$ is directed to ground via the conductive memory cell $3_{m,n}$. As a result, the column decoder 6 has no input of current from the data line DL. Conversely, when the memory cell $3_{m,n}$ has a logic "1" therein its channel region 14 is non-conductive because the voltage Vm does not exceed the higher threshold voltage. The current flowing through data line $DL_m$ is not conducted to ground through cell $3_{m,n}$ and therefore it is injected into the column decoder 6 without loss to ground.

Figures 9, 10:
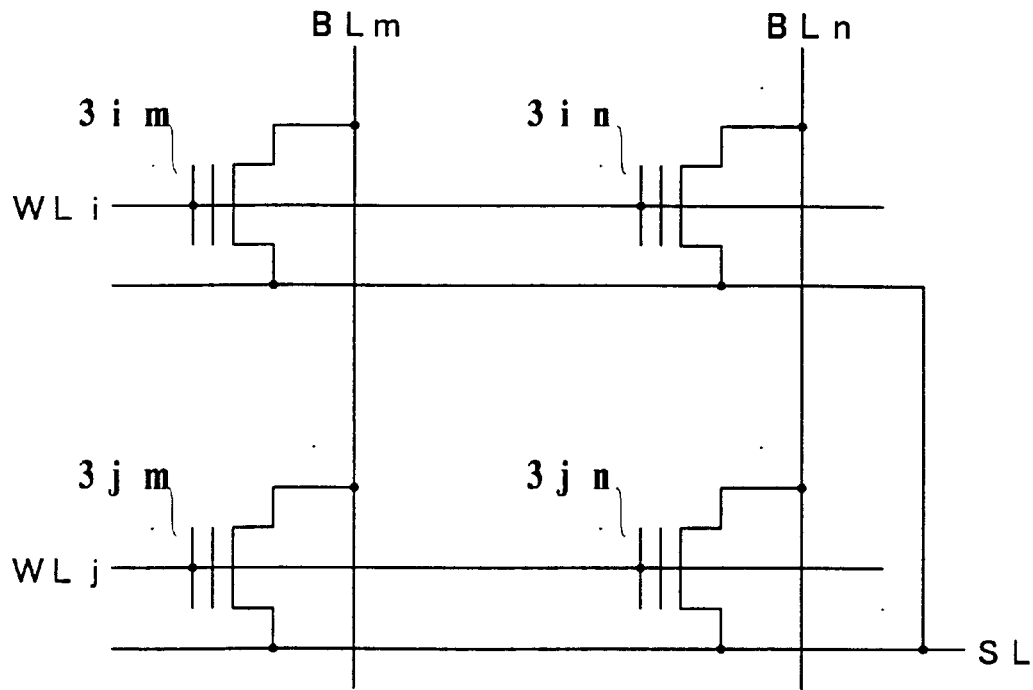
FIG. 9 shows memory circuit of another embodiment, using the memory cell 3.
FIG. 10 shows a combination of voltage applied to individual lines for erasing, programming and reading operations.

The column decoder 6 is arranged to put out only the current from the data line DLm. This output is amplified and read by the sense amplifier 10. It is noted that the voltage $V_{dd}$ is applied the rest of data lines through the resistor 30 for the case where data are read from the memory cells at same time. FIG. 9 illustrates an equivalent circuit showing the construction of an LSI memory utilizing the memory cell 3 for describing another embodiment of the present invention. As shown in FIG. 9, all the source of the memory cells are connected with source lines SL. Also, bit lines BL are connected with corresponding drain of the memory cells which are located at row direction. Further, word lines WL are connected with corresponding gate of the memory cells which are located at column direction. Note that, the word lines are spanned at the row direction of the LSI memory.

Now, FIG. 10 is a table showing an example of combination of voltage applied to individual lines for erasing, programming (writing) and reading operation, when memory cell 3 im is designated as a selected memory cell. When erasing information from the cell 3 im, a "erasing voltage" of 10 V is applied to the word line WLi, a voltage 0 V is applied to other individual lines. To program information into the memory cell 3 im, a "programming voltage" of −5 V is applied to word line WLi, a voltage of 5 V is applied to the bit line BLm and a voltage 0 V is applied to other individual lines. When reading in formation from the cell 3 im, a "reading voltage" of 2 V is applied to word line WLi, a voltage −2 V is applied to other word lines. At the same time, a voltage of 2 V is applied to the bit line BLm and other bit lines are under floating. Under this state, reading is effected by sensing current flow from the bit line BLm to the source line SL.

The manufacturing process for the memory cells 3 having the construction as described above will be described below with reference to FIGS. 6A to 6D.

Figure 6A:
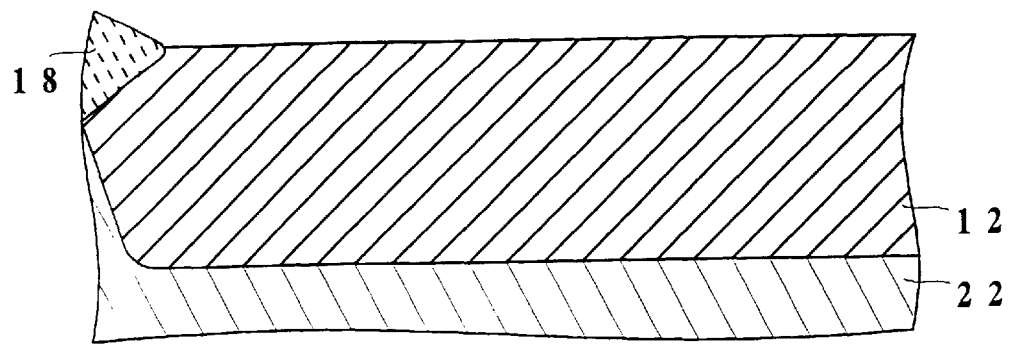
FIGS. 6A through 6D are views showing the manufacturing process of the memory cell 3.
Figure 6B:
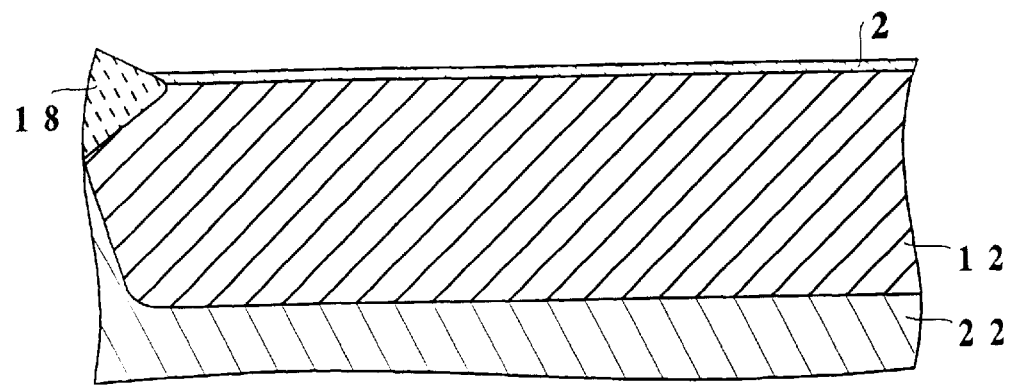
Figure 6C:
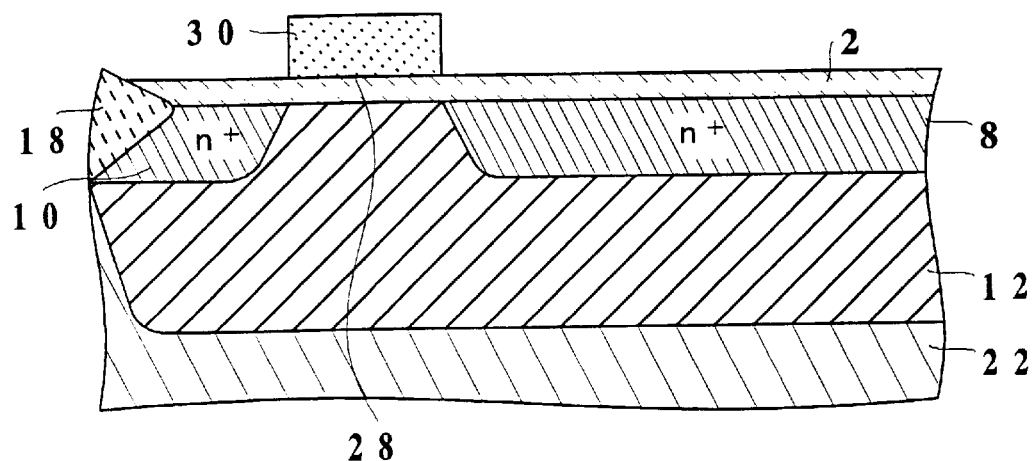
Figure 6D:
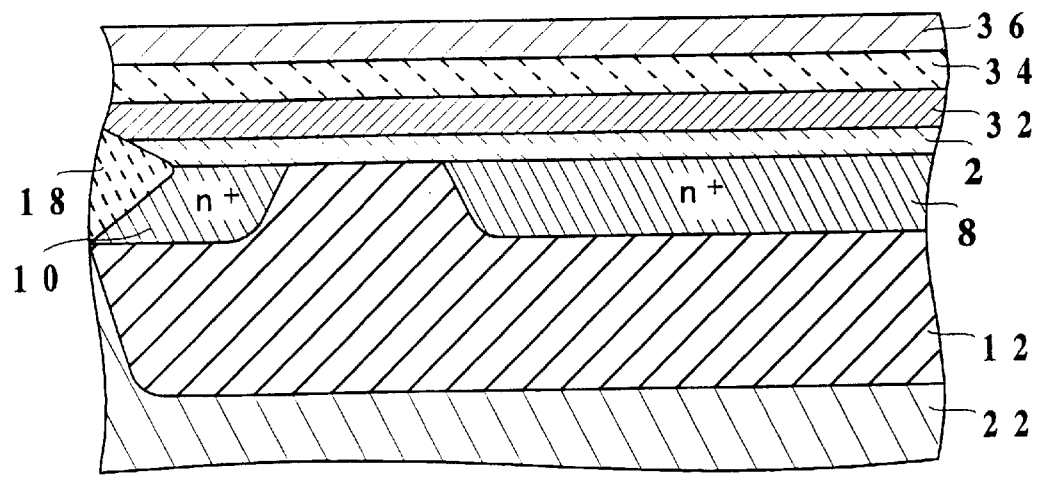

With a n-type silicon substrate 22 prepared, a p-type silicon well 12 is created within the silicon substrate 22 and is divided into the plural by field oxide layers 18 (FIG. 6A). A thin silicon dioxide film 2 is formed on top of the p-type silicon well 12 by thermal oxidation (FIG. 6B). It is noted that threshold voltage of the memory cell is arranged by implanting dopant into the well 12. Then after forming a resist pattern 30 on top of a thin silicon dioxide portion 28 in order to create a drain and a source, arsenic or phosphorus is ion-implanted into the well 12 and thermally diffused, thereby forming an n⁺ drain 8 and an n⁺ source 10 within the well 12 (FIG. 6C). Then removing the resist pertain 30, a polysilicon layer 32, a SrTiO₃ layer 34 and a polysilicon layer 36 are deposited in respective order by the CVD method (FIG. 6D). The result is then subjected to etching using resist as a mask thereby forming the polysilicon layer 32, the SrTiO₃ layer 34 and the polysilicon layer 36 (FIG. 2). Thereafter, the wiring between each memory elements is completed and then the memory elements is covered with an insulating layer (not shown).

As described above, the LSI memory constructed using the memory cells 3 can work as memory without such tunneling wind as the thin silicon dioxide potion 2a in the prior art memory cell 1. In alternative embodiment, the thin silicon dioxide portion may be provided in the silicon dioxide film 2.

Although, in the above embodiment, the SrTiO₃ layer is used as layer comprised of the high dielectric substance, in alternative embodiment, layer comprised of PbTiO₃, PZT, PLZT or the like may be used.

Also, although, in the above embodiment, the polysilicon layers is used for the conductive layer and the control electrode respectively, in alternative embodiment, layer comprised of other high melting metal may be used.

In addition, although the first conductive type has been assumed to be p-type and the second to be n-type in the above embodiment, in alternative embodiment, the first conductive type is n-type and the second is p-type.

The nonvolatile semiconductor memory according to the present invention is characterized in that layer comprised of high dielectric substance like SrTiO₃ is used as the second insulating layer. Therefore, when a programming voltage is applied between control electrode and ether of diffusion regions the partial pressure applied to the first insulating film relative to the programming voltage increases. In other word, in spite of the lower programming voltage, the electric field strength in the first insulating layer can be obtained which is necessary to write or erase information into or from the memory. Accordingly, the miniaturization and integration of the nonvolatile semiconductor memory can be facilitated.

Although the present invention has been fully described by way of example with reference to the accompanying drawings, it is to be noted here that various changes and modifications will be apparent to those skilled in the art. Therefore, unless otherwise such changes and modifications depart from the scope of the present invention as defined by the appended claims, they should be construed as included therein.

What is claimed is:

1. A device including a nonvolatile memory having write, erase and read modes, comprising:
    a) a first conductive type semiconductor region;
    b) a pair of second conductive type diffusion regions formed within said first conductive type semiconductor region forming source and drain diffusion regions separated by a channel region comprised of at least a portion of said first conductive type semiconductor region;
    c) a first gate insulating layer formed on said first conductive type semiconductor region;
    d) a floating gate conductive layer formed on said first gate insulating layer;
    e) a second gate insulating layer having a high dielectric constant of not less than 50 and formed on said floating gate conductive layer, said second gate insulating layer being comprised of a layer of insulating material selected from the group comprising: strontium titanate (SrTiO₃), PbTiO₃, PZT, or PLZT; and
    f) a conductive control electrode formed on said second gate insulating layer;
    and wherein said first gate insulating layer is thin enough given the thickness and dielectric constant of said second gate insulating layer to permit Fowler-Nordheim tunneling when either a write or erase voltage between 7 and 13 volts is applied said between said drain diffusion region and said control electrode.

2. A device including a nonvolatile memory cell having write, erase and read modes, comprising:
    a) a first conductive type semiconductor region;
    b) a pair of second conductive type diffusion regions formed within said first conductive type semiconductor region forming source and drain diffusion regions separated by a channel region comprised of at least a portion of said first conductive type semiconductor region;
    c) a first gate insulating layer formed on said first conductive type semiconductor region;
    d) a floating gate conductive layer formed on said first gate insulating layer;

e) a floating gate insulating layer having a high dielectric constant and formed on said floating gate conductive layer; and f) a conductive electrode comprising a control gate and formed on said floating insulating layer;

and wherein said first gate insulating layer is thin enough to permit tunneling when a programming voltage is applied, and wherein the overlap between said drain diffusion region and said floating gate conductive layer is greater than the overlap between said source diffusion region and said floating gate conductive layer;

and wherein said floating gate insulating layer has a dielectric constant selected relative to a thickness and dielectric constant of said first gate insulating layer such that tunneling will be caused in both erase program mode as well as write program mode voltage conditions, wherein said write program mode voltage conditions cause a logic "0" to be written into said nonvolatile memory cell and comprise the application of a voltage of approximately 7 to 13 volts between said drain diffusion region and said control gate with said drain diffusion region being more positive than said control oate while holding said source diffusion region at 0 volts, and wherein said erase mode voltage conditions cause a logic "0" to be erased from said nonvolatile memory cell and comprise the application of a voltage of approximately +7 to 13 volts to said control gate relative to said drain diffusion region.

3. The apparatus of claim 2 wherein said floating gate insulating layer is strontium titanate ($SrTiO_3$) or lead titanate ($PbTiO_3$) or an oxide including lead, lanthanum, zirconium titanium (PLZT) or lead zirconate titanate (PZT).

4. The apparatus of claim 2 wherein said floating gate insulating layer is lead titanate ($PbTiO_3$) or PZT.

5. The apparatus of claim 2 wherein said floating gate insulating layer is comprised of a combination of lead zirconate titanate and oxide including lead, lanthanum, zirconium titanium (PLZT).

6. The apparatus of claim 2 wherein said floating gate insulating layer is comprised of strontium titanate.

* * * * *